United States Patent [19]

Foell et al.

[11] Patent Number: 5,130,643
[45] Date of Patent: Jul. 14, 1992

[54] METHOD FOR DETERMINING THE RECOMBINATION RATE OF MINORITY CARRIERS AT BOUNDARY SURFACES BETWEEN SEMICONDUCTORS AND OTHER SUBSTANCES

[75] Inventors: Helmut Foell; Volker Lehmann, both of Munich, Fed. Rep. of Germany

[73] Assignee: Siemens Aktiengesellschaft, Berlin and Munich, Fed. Rep. of Germany

[21] Appl. No.: 617,588

[22] Filed: Nov. 26, 1990

Related U.S. Application Data

[63] Continuation-in-part of Ser. No. 522,107, May 11, 1990, abandoned.

Foreign Application Priority Data

May 31, 1989 [DE] Fed. Rep. of Germany ....... 3917721

[51] Int. Cl.$^5$ ............................................. G01R 31/26
[52] U.S. Cl. .............................. 324/158 R; 324/73.1; 324/158 D
[58] Field of Search .............. 324/158 R, 158 D, 73.1, 324/, 71.3; 437/8; 136/290

[56] References Cited

U.S. PATENT DOCUMENTS

| | | | |
|---|---|---|---|
| 4,333,051 | 6/1982 | Goodman | 324/158 D |
| 4,433,288 | 2/1984 | Moore | 324/158 D |
| 4,454,472 | 6/1984 | Moore | 324/158 D |
| 4,511,838 | 4/1985 | Reichman et al. | 324/158 D |
| 4,841,239 | 6/1989 | Foell et al. | 324/158 D |

FOREIGN PATENT DOCUMENTS

| | | |
|---|---|---|
| 0000489 | 8/1981 | European Pat. Off. |
| 3732065 | 4/1988 | Fed. Rep. of Germany |
| 1514697 | 6/1978 | United Kingdom |

OTHER PUBLICATIONS

Johnson N. M., "Measurement of Semiconductor-Insulator Interface States by Constant-Capacitance, Deep Level Transient Spectroscopy", J. Vac. Sci. Technol. vol. 21, No. 2, 1982, pp. 303-314.

Rabbani et al., "A Quick Method for the Determination of—Measurements", Solid State Electronics, vol. 26, 1981, pp. 661-664.

Watanabe et al., "Determination of Minority-Carrier Lifetime and Surface Recombination Velocity with High Spacial Resolution", IEEE Trans. on Electron Devices, vol. ED-24, No. 9, 1977, pp. 1172-1177.

Grivet et al., "Device for Detecting Defects in P-Silicon Substrate", IBM Technical Disclosure Bulletin, vol. 22, No. 4, 1979, p. 1499.

Das G., "Nondestructive Electrolytic Localization of Pipe Sites in Bipolar Transistors", IBM Technical Disclosure Bulletin, vol. 20, No. 2, 1977, pp. 604-607.

Lehmann et al., "Minority Carrier Diffusion Length Mapping in Silicon Wafers Using a Si-Electrolyte Contact", J. Electrochemical Society, No. 135L, 1988 pp. 2831-2835.

*Primary Examiner*—Kenneth A. Wieder
*Assistant Examiner*—Vinh P. Nguyen
*Attorney, Agent, or Firm*—Hill, Van Santen, Steadman & Simpson

[57] ABSTRACT

For a two-stage measuring method, a respective cell having an electrode therein is applied to the front surface and to the rear surface of a semiconductor wafer, whereby only the cell as the rear surface is filled with an electrolyte in the first measuring step. The minority carrier photo current $I_2'$ flowing between the electrode and the semiconductor surface in the rear cell, given illumination of the front cell of the semiconductor crystal wafer, is dependent on the recombination speed S at the front surface. In the second measuring step, the front cell is also filled with electrolyte and both the rear surface photo current $I_2$, given what is now a negligible influence of the value S as well as the front surface photo current $I_1$ are measured. The recombination speed S can be calculated from the measure photo currents with the assistance of a mathematical equation. Given point-by-point illumination and scanning over the crystal wafer, the topical distribution of the recombination speed is obtained.

6 Claims, 2 Drawing Sheets

METHOD FOR DETERMINING THE RECOMBINATION RATE OF MINORITY CARRIERS AT BOUNDARY SURFACES BETWEEN SEMICONDUCTORS AND OTHER SUBSTANCES

CROSS REFERENCE TO RELATED APPLICATION

This application is a continuation-in-part application of our prior application Ser. No. 522,107, filed May 11, 1990, now abandoned.

BACKGROUND OF THE INVENTION

1. Field of the Invention

The present invention relates to a method for determining the recombination rate of minority carriers at boundary surfaces between semiconductors and other substances in which a first half cell is attached to the front side of a semiconductor crystal body, a second half cell is applied to the rear side of the semiconductor crystal body and both half cells can be filled with an electrolyte, in which at least a second half cell contains an electrode and is filled with the electrolyte in contact with the electrode and the rear side of the semiconductor crystal body, in which at least the electrode in the second half cell is connected to the semiconductor crystal body via a voltage source and via an ohmic contact, in which a DC voltage is applied to the voltage source so that an inhibiting space charge zone is generated at the rear side of the semiconductor crystal body, and in which the front side is illuminated with a light source.

2. Description of the Prior Art

The boundary surface recombination speed S is a measure for the speed with which minority carriers disappear at a boundary surface through recombination (See S. M. Sze, Physics of Semiconductors, Whiley-Interscience Publishers). It is proportional to the boundary surface state density N, i.e. the density of electrically-active states in the band gap.

The boundary surface recombination speed S or the boundary surface state density N is one of the important parameters for characterizing boundary surface such as, for example, the boundary surface $Si-SiO_2$ with respect to their electrical properties. The electrical properties and the long-term behavior of transistors in integrated circuits are influenced as a result thereof. In addition, the boundary surface recombination speed S can also be employed as a monitoring quantity when monitoring layer manufacturing methods in the fabrication of microelectronic components.

Deep level transient spectroscopy (DLTS) can be employed for the calculation of the parameter S; such as method is set forth in the article by N. M. Johnson, J. Vac, Sci, Techn., Vol. 21, 1982, p. 303. To that end, a metal-oxide-semiconductor (MOS) capacitor must be applied onto the semiconductor. An alternating voltage that is superposed on a DC voltage is applied to the metal gate, so that the boundary state density and recombination speed can be calculated therefrom.

A second method of calculating the recombination speed measures the chronological change of the capacitance of such a MOS capacitor, the cause of this change being thermal generation of electron-hole pairs (See K. S. Rabbani, et al, Solid State Electronics, Vol. 24, 1981, p. 661.).

The mentioned methods require special test structures and are highly time consuming, even given measurement with low topical resolution.

SUMMARY OF THE INVENTION

It is therefore an object of the present invention to provide a simple method with high topical resolution for calculating the recombination speed of minority carriers at boundary surfaces between semiconductors and other substances, whereby no test structures are required.

In a method of the type generally set forth above, this object is achieved where the method is particularly characterized in that a two-stage measuring method is utilized wherein only the second half cell is filled with electrolyte in one measuring step and a first photo current flowing in the second half cell between the electrode and the rear side is measured, and both half cells are filled with electrolyte in the other measuring step and a second photo current flowing in the second half cell between the electrode and the rear side is measured, and the boundary surface recombination speed is calculated therefrom with the assistance of the mathematical equation $$S = D\alpha(1-A)/[A-\alpha L \tanh(X/L)].$$

where D is a diffusion constant of the charge carriers, $\alpha$ is the absorption constant of the light, A is equal to $I_2/I_2'$ which is the ratio of the second photo current to the first photo current, L is the diffusion length and X is the thickness of the wafer.

According to a particular feature of the invention, the illumination for developing the photo currents is carried out over the entire surface of the wafer.

According to another feature of the invention, the method is particularly characterized in that the light beam is focused onto the front side of the semiconductor crystal body and scan the front side of the crystal body so that a topically-resolved measurement occurs.

According to another feature o the invention, the method is particularly characterized in that a laser is employed as the light source.

According to another feature of the invention, the method is particularly characterized in that a diluted hydrofluoric acid having a concentration $C > 0.5\%$ is employed as the electrolyte. According to another feature of the invention, the method is particularly characterized in that the first half cell contains an electrode and is filled with the electrolyte that is in contact with the electrode and with the front side of the semiconductor crystal body, in that the electrode in the first half cell is connected to the semiconductor crystal body via a voltage source and the ohmic contact, in that a D.C. voltage is applied to the voltage source so that an inhibiting space charge zone is generated at the front side, in that the other measuring step, a third photo current flowing in the first half cell between the electrode and the front side is additionally measured, and in that the diffusion length is calculated from the second photo current and from the third photo current.

BRIEF DESCRIPTION OF THE DRAWINGS

Other objects, features and advantages of the invention, its organization, construction and operation will be best understood from the following detailed description, taken in conjunction with the accompanying drawings, on which:

FIGS. 2-4 illustrate topically-resolved measurements over a silicon wafer in which FIG. 2 illustrates the rear side photo current $I_2'$ without electrolyte filling of the front cell, FIG. 3 illustrates the rear side photo current $I_2$ with electrolyte filling the front half cell, and FIG. 4 illustrates the recombination speed S.

DESCRIPTION OF THE PREFERRED EMBODIMENT

Figure 1:
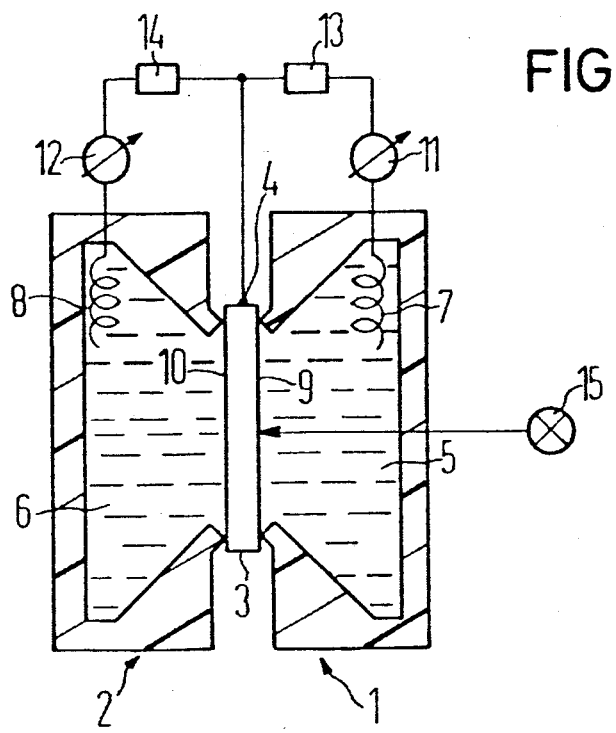
FIG. 1 is a schematic illustration of a greatly simplified cross section through an electrolyte double cell.

According to FIG. 1, a semiconductor crystal member 3 (referred to as a wafer) is located between two half cells, hereinafter simply "cells" 1, 2 that can be filled with electrolyte 5, 6. For example, 2% hydrofluoric acid with the addition of a wetting agent can be employed as the electrolyte. When the first cell 1 is filled with electrolyte, then the electrolyte is in contact with an electrode 7 and with the front side 9 of the wafer 3. The wafer 3 is connected to a D.C. voltage source 13 via an ohmic contact 4, the other pole of the D.C. voltage source 13 being connected to the electrode 7 via an ammeter 11. The second cell 2 at the rear side 10 of the wafer is analogously constructed. An electrode 8 is located in an electrolyte 6 contained in the cell 2 and the electrode 8 is connected to a D.C. voltage source 14 via an ammeter 12, the other pole of the D.C. voltage source 14 being likewise connected to the wafer 3 by way of the ohmic contact 4. The electrolyte can be circulated and aerated (not shown) in each cell.

A voltage is applied to the D.C. voltage source 14 such that an inhibiting space charge zone is formed at the rear side 10 of the wafer 3 (given, for example, a p-silicon wafer, approximately $-5$ volts are applied to the contact 4). When the front side 9 is now illuminated with light of a visible wavelength from a light source 15, electron-hole pairs are generated in a thin layer (1-2 $\mu$). The minority carriers diffuse to the rear side 10 of the wafer and produce a photo current $I_2$ in the cell 2 that is measured with the ammeter 12. Given a known wafer thickness, the photo current is dependent on the diffusion length L of the minority carriers in the semiconductor 3 and on the boundary surface state density N at the front side 9 of the wafer. As a result of filling the first cell 1 with an electrolyte 5, the density N is so low that only a negligible portion of the generated minority carriers recombine at the front side 9, so that $I_2 = I_2(L)$ applies.

When, however, the measuring cell 1 is not filled with an electrolyte, the boundary surface states N now present at the arbitrary boundary surface (for example, $Si-SiO_2$ in the case of the silicon wafer is oxidized) can now greatly influence the photo current $I_2'$ that is now measured at the rear side 10; this is set forth in greater detail in the article by V. Lehmann and H. Foell in the J. Electrochem. Soc., Vol. 135, 1988, p. 2381. The current $I_2'$ measured in this case is then a function of the diffusion length L and of the boundary surface recombination speed S, i.e. $I_2 = I_2'(L, S)$ applies.

In order to be able to calculate the recombination speed S from successive measurements of the photo currents $I_2$ and $I_2'$, the diffusion length L must also be identified. This can advantageously be carried out with the method discussed in the European application 0 295 440 and in U.S. Pat. No. 4,841,239, fully incorporated herein by this reference. Given filled half cells 1, 2, the front side photo current $I_1$ is additionally measured with the assistance of the ammeter 11 in that an inhibiting space charge zone is produced at the front side 9 of the wafer 3 with the D.C. voltage source 13 and a photo current $I_1$ is generated in the front cell 1 with the assistance of the illumination by the light source 15 (the rear cell 2 is not connected). This photo current $I_1$ is practically independent of the diffusion length L and, due to filling of the first cell 1, is also practically independent of the boundary surface state density N. The diffusion length L can be calculated from the intensity of the photo currents $I_1$ and $I_2$ in accordance with the relationship $$I_1 I_2 = (\alpha^2 \cdot L^2) \cdot -2/[\exp(-XL) + \exp(+XL)].$$

When the diffusion length is already known, for example, from other measurements, a circuit of the first cell is not required. The D.C. voltage source 13, the ammeter 11 and the electrode 7 can then be omitted.

The boundary surface recombination speed S is then calculated from the values I, $I_2$ and $I_2'$ with the assistance of the mathematical equation $$S = D\alpha(1-A)/[A - \alpha L \tanh(X/L)],$$

where D is the diffusion constant of the charge carriers, $\alpha$ is the absorption constant of the light, A is equal to the $I_2/I_2'$ ratio of the second photo current to the first photo current, L is the diffusion length and X is the thickness of the wafer.

When the wafer is illuminated across its entire surface in both measuring steps, the mean value of the speed S over the wafer is obtained. The recombination speed S can be identified topically resolved when scanning the front side with a focused light beam or with a laser beam.

A measurement of the value X can then be carried out as follows. The rear photo current $I_2'$ is measured in a first measuring step without filling the cell 1 with an electrolyte. The front side 9 is scanned with the light of a helium neon laser 15. The measured values are individually stored for each point of the wafer. In a second measuring step, the second cell is filled with 2% HF (layers on the semiconductor wafer may have been previously dissolved). The rear side photo current $I_2$ and the front side photo current $I_1$ are measured topically resolved. As disclosed in the aforementioned European application 0 295 440, the diffusion length L is calculated from the photo currents $I_2$ and $I_1$. The boundary surface recombination speed S is calculated therefrom in a topically-resolved manner with the assistance of the above-mentioned mathematical equation.

Figure 2:
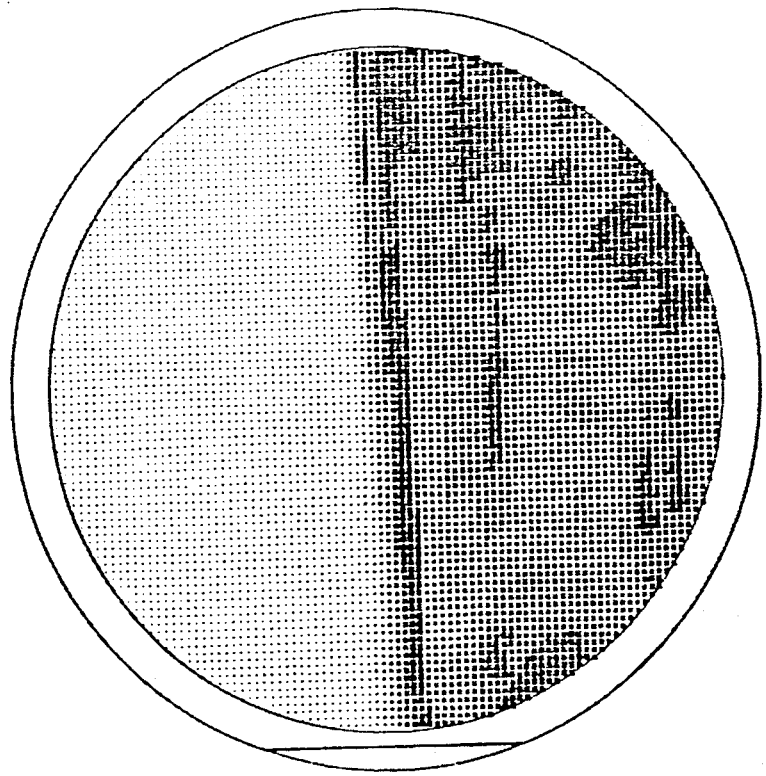
Figure 3:
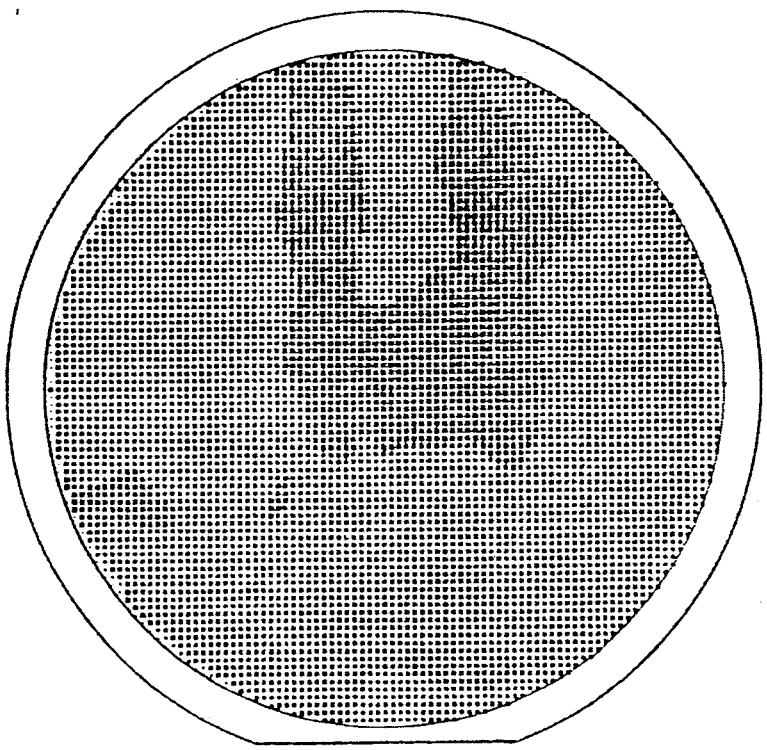
Figure 4:
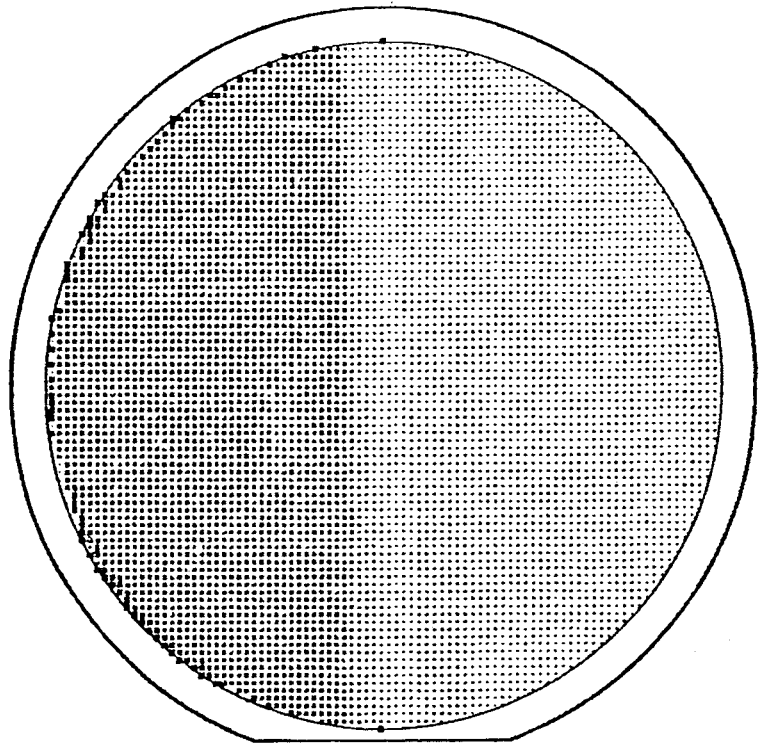

FIGS. 2-4 illustrate an example of a measured result. An untreated Si wafer with one-half (left-hand half in FIG. 2) held in a diluted HF solution for about one minute. Subsequently, the photo currents $I_2'$ and $I_2$ were measured as described. The currents measured point-by-point are shown in a gray scale in FIGS. 2 and 3, whereby the scale differ in the two illustrations. Due to the recombination at boundary surface states, $I_2'$ at the treated side of the wafer in FIG. 2 is extremely low, whereas the untreated and therefore practically non-oxidized side has higher values; the $I_2$ values lie even higher in FIG. 3 since the boundary surface states are now saturated. The quantitative evaluation with the assistance of the above-mentioned mathematical equation yields the topically-resolved measured result of the recombination speed S that is shown in FIG. 4. The average values of S lie at $3.8 \times 10^6$ cm/sec for the treated surface and $1.3 \times 10^3$ cm/sec for the surface not treated with HF.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a method for determining the recombination speed of minority carriers at boundary surfaces between semiconductors and other substances, the method being of the type which includes the steps of attaching first and second cells, at least the second cell having an electrode therein, to respective front and rear surfaces of a semiconductor crystal body, the cells being fillable with an electrolyte so that the electrolyte contacts the front and rear surfaces and the electrode, connecting the electrode in the second cell to the semiconductor body via a voltage source and an ohmic contact, applying a D.C. voltage to the voltage source to generate an inhibiting space charge zone at the rear surface of the semiconductor crystal body, and illuminating the front surface with a light source, the improvement therein of a two-stage measurement comprising one measuring step and another measuring step, wherein:

in the one measuring step, filling only the second cell with the electrolyte and measuring a first photo current $I_2'$ flowing in the second cell between the electrode and the rear surface;

in the other measuring step, filling the first cell with the electrolyte so that both of the cells are filled with electrolytes, and measuring a second photo current $I_2$ flowing in the second cell between the electrode and the rear surface; and then calculating the boundary surface recombination speed in calculating the boundary surface recombination speed in accordance with the equation $$S = D\alpha(1-A)/[A-\alpha L \tanh(X/L)],$$

where D is the diffusion constant of the charge-carriers, $\alpha$ is the absorption constant of the light, A is the ratio $I_2 I_2'$ of the second photo current to the first photo current, L is the diffusion length and X is the thickness of the semiconductor crystal body.

2. The improved method of claim 1, wherein illuminating is further defined as:

illuminating the entire surface of the semiconductor crystal body.

3. The improved method of claim 1, wherein illuminating is further defined as:

focusing a light beam onto the front surface of the semiconductor crystal body; and scanning the semiconductor crystal with the light beam to obtain a topically-resolved measurement.

4. The improved method of claim 1, wherein illuminating is further defined as:

generating and directing laser light with a laser source onto the front surface of the semiconductor crystal body.

5. The improved method of claim 1, wherein the step of filling is further defined as:

filling at least the second cell with a diluted hydrofluoric acid having a concentration $C \geq 0.5\%$.

6. The improved method of claim 1, wherein the first cell includes an electrode in the electrolyte, and further defined by the steps of:

connecting the electrode of the first cell to the semiconductor crystal body via another voltage source and the ohmic contact;

applying a D.C. voltage to the another voltage source to generate an inhibiting space charge zone at the front surface;

measuring the flow of a third photo current $I_1$ through the electrolyte in the first cell from the electrode of the first cell and the front surface; and calculating the diffusion length L from the second and third photo currents $I_2, I_1$ in accordance with the expression $$I_2/I_1 = \alpha^2 \cdot L/(1-\alpha^2 L^2) \cdot -2/[\exp(-X/L) + \exp(+X/L)].$$

* * * * *